United States Patent
Yanamanamanda et al.

(10) Patent No.: US 9,230,688 B2
(45) Date of Patent: Jan. 5, 2016

(54) DETERMINING AN AGE OF DATA STORED IN MEMORY

(71) Applicant: Micron Technology, Inc., Boise, ID (US)

(72) Inventors: Satish K. Yanamanamanda, San Jose, CA (US); Sampath K. Ratnam, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 141 days.

(21) Appl. No.: 14/075,704

(22) Filed: Nov. 8, 2013

(65) Prior Publication Data

US 2015/0135027 A1 May 14, 2015

(51) Int. Cl.
| | |
|---|---|
| *G11C 29/00* | (2006.01) |
| *G11C 29/50* | (2006.01) |
| *G11C 7/14* | (2006.01) |
| *G11C 16/34* | (2006.01) |
| *G11C 29/02* | (2006.01) |

(52) U.S. Cl.
CPC ............ *G11C 29/50004* (2013.01); *G11C 7/14* (2013.01); *G11C 16/3418* (2013.01); *G11C 16/3422* (2013.01); *G11C 29/021* (2013.01); *G11C 29/028* (2013.01)

(58) Field of Classification Search
CPC ............... G11C 2029/5004; G11C 29/50004; G11C 16/10; G11C 16/349; G11C 16/3459; G11C 16/04; G11C 29/52; G11C 16/00; G11C 2029/0409; G11C 13/0004; G11C 13/0033; G11C 13/0069; G11C 29/12005; G11C 29/50; G11C 16/3431; G11C 29/50016; G06F 11/1068; G06F 11/1072
See application file for complete search history.

(56) References Cited

U.S. PATENT DOCUMENTS

| | | | | |
|---|---|---|---|---|
| 9,007,842 | B2* | 4/2015 | Chen et al. | 365/185.2 |
| 2009/0034343 | A1* | 2/2009 | Nirschl et al. | 365/189.07 |
| 2014/0059405 | A1* | 2/2014 | Syu et al. | 714/773 |
| 2014/0068365 | A1* | 3/2014 | Chen et al. | 714/746 |
| 2014/0269048 | A1* | 9/2014 | Chen et al. | 365/185.2 |

* cited by examiner

*Primary Examiner* — Guerrier Merant
(74) *Attorney, Agent, or Firm* — Brooks, Cameron & Huebsch, PLLC

(57) ABSTRACT

The present disclosure includes apparatuses and methods for determining an age of data stored in memory. A number of embodiments include determining a sensing voltage that results in a particular error rate being associated with a sense operation performed on a memory using the sensing voltage, determining a difference between the determined sensing voltage and a program verify voltage associated with the memory, and determining an age of data stored in the memory based on the determined difference.

23 Claims, 3 Drawing Sheets

| DIFFERENCE BETWEEN DETERMINED SENSING VOLTAGE AND PROGRAM VERIFY VOLTAGE | AGE OF DATA |
| --- | --- |
| 0 - 50 mV | LESS THAN 15 DAYS |
| 50 - 150 mV | 1 MONTH |
| 150 - 300 mV | 2 MONTHS |
| 300 - 500 mV | 3 MONTHS |
| 500 - 1000 mV | 6 MONTHS |

US 9,230,688 B2

DETERMINING AN AGE OF DATA STORED IN MEMORY

TECHNICAL FIELD

The present disclosure relates generally to semiconductor memory and methods, and more particularly, to determining an age of data stored in memory.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can retain stored data when not powered and can include NAND flash memory, NOR flash memory, phase change random access memory (PCRAM), resistive random access memory (RRAM), and magnetic random access memory (MRAM), among others.

Memory devices can be combined together to form a solid state drive (SSD). An SSD can include non-volatile memory (e.g., NAND flash memory and/or NOR flash memory), and/or can include volatile memory (e.g., DRAM and/or SRAM), among various other types of non-volatile and volatile memory. Flash memory devices can include memory cells storing data in a charge storage structure such as a floating gate, for instance, and may be utilized as non-volatile memory for a wide range of electronic applications. Flash memory devices typically use a one-transistor memory cell that allows for high memory densities, high reliability, and low power consumption.

Memory cells in an array architecture can be programmed to a target (e.g., desired) state. For instance, electric charge can be placed on or removed from the charge storage structure (e.g., floating gate) of a memory cell to program the cell to a particular data state. The stored charge on the charge storage structure of the memory cell can indicate a threshold voltage (Vt) of the cell.

For example, a single level cell (SLC) can be programmed to a targeted one of two different data states, which can be represented by the binary units 1 or 0. Some flash memory cells can be programmed to a targeted one of more than two data states (e.g., 1111, 0111, 0011, 1011, 1001, 0001, 0101, 1101, 1100, 0100, 0000, 1000, 1010, 0010, 0110, and 1110). Such cells may be referred to as multi state memory cells, multiunit cells, or multilevel cells (MLCs). MLCs can provide higher density memories without increasing the number of memory cells since each cell can represent more than one digit (e.g., more than one bit).

As the age of the data stored in flash memory cells increases (e.g., as the amount of time the data has been stored in the cells increases), the accuracy and/or reliability of the data may decrease, which may eventually lead to a read error. To reduce the probability of and/or prevent such an error, the data may be periodically refreshed (e.g., the cells may be periodically re-programmed to the target state to which they were previously programmed). For example, the data may be refreshed if the data has reached a certain age.

DETAILED DESCRIPTION

Figure 1:
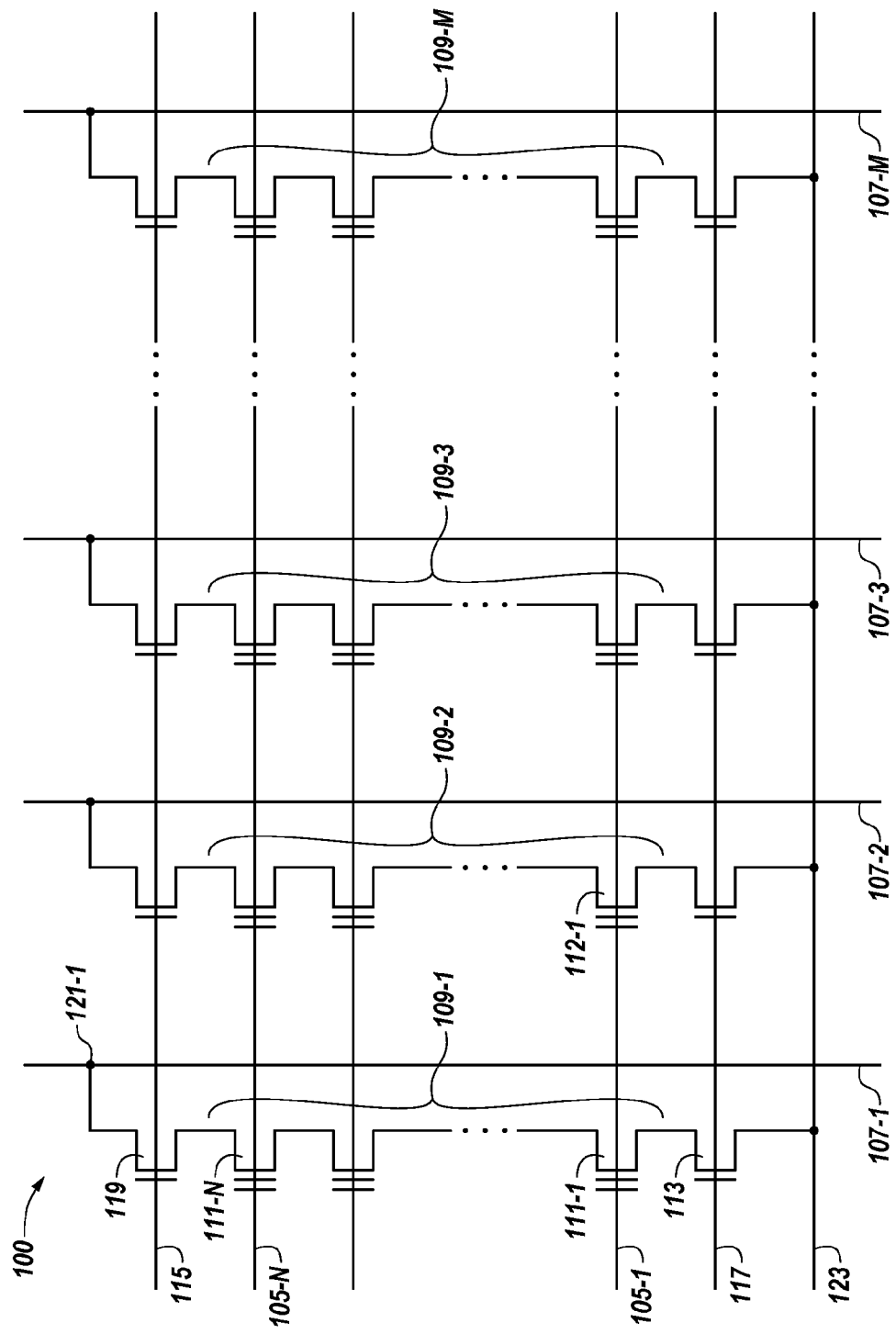
FIG. 1 illustrates a schematic diagram of a portion of a non-volatile memory array in accordance with a number of embodiments of the present disclosure.

The present disclosure includes apparatuses and methods for determining an age of data stored in memory. A number of embodiments include determining a sensing voltage that results in a particular error rate being associated with a sense operation performed on a memory using the sensing voltage, determining a difference between the determined sensing voltage and a program verify voltage associated with the memory, and determining an age of data stored in the memory based on the determined difference.

Determining the age of data stored in memory (e.g., flash memory cells), and therefore when to refresh the data, may not be difficult if the memory remains (e.g., is always) powered on. However, if the memory is powered off, previous approaches may not be able to track and/or take into account the amount of time for which the memory device is powered off, which can make it difficult to determine the age of the data.

Embodiments of the present disclosure can track and/or take into account the amount of time for which memory is powered off, and therefore can determine the age of data stored in the memory more effectively, accurately, and/or reliably than previous approaches (e.g., approaches that can not track and/or take into account the amount of time for which the memory is powered off). Further, embodiments of the present disclosure can determine the age of the data stored in the memory without using a reference cell, which can reduce the size, reduce the complexity, and/or increase the performance (e.g., increase the speed, increase the reliability, and/or decrease the power consumption) of the memory, among other benefits.

As used herein, "a number of" something can refer to one or more such things. For example, a number of memory cells can refer to one or more memory cells. Additionally, the designators "M" and "N", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 100 may reference element "00" in FIG. 1, and a similar element may be referenced as 400 in FIG. 4.

FIG. 1 illustrates a schematic diagram of a portion of a non-volatile memory array 100 in accordance with a number of embodiments of the present disclosure. The embodiment of FIG. 1 illustrates a NAND architecture non-volatile memory array. However, embodiments described herein are not limited to this example. As shown in FIG. 1, memory array 100 includes access lines (e.g., word lines 105-1, ..., 105-N) and intersecting data lines (e.g., local bit lines) 107-1, 107-2, 107-3, ..., 107-M. For ease of addressing in the digital environment, the number of word lines 105-1, ..., 105-N and the number of local bit lines 107-1, 107-2, 107-3, ..., 107-M can be some power of two (e.g., 256 word lines by 4,096 bit lines).

Memory array 100 includes NAND strings 109-1, 109-2, 109-3, ..., 109-M. Each NAND string includes non-volatile memory cells 111-1, ..., 111-N, each communicatively coupled to a respective word line 105-1, ..., 105-N. Each NAND string (and its constituent memory cells) is also associated with a local bit line 107-1, 107-2, 107-3, ..., 107-M. The non-volatile memory cells 111-1, ..., 111-N of each NAND string 109-1, 109-2, 109-3, ..., 109-M are connected in series source to drain between a source select gate (SGS) (e.g., a field-effect transistor (FET)) 113, and a drain select gate (SGD) (e.g., FET) 119. Each source select gate 113 is configured to selectively couple a respective NAND string to a common source 123 responsive to a signal on source select line 117, while each drain select gate 119 is configured to selectively couple a respective NAND string to a respective bit line responsive to a signal on drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to bit line 107-1 of the corresponding NAND string 109-1 at drain contact 121-1. The source of drain select gate 119 is connected to the drain of the last memory cell 111-N (e.g., a floating-gate transistor) of the corresponding NAND string 109-1.

In a number of embodiments, construction of non-volatile memory cells 111-1, ..., 111-N includes a charge storage structure such as a floating gate, and a control gate. Non-volatile memory cells 111-1, ..., 111-N have their control gates coupled to a word line, 105-1, ..., 105-N respectively. A "column" of the non-volatile memory cells, 111-1, ..., 111-N, make up the NAND strings 109-1, 109-2, 109-3, ..., 109-M, and are coupled to a given local bit line 107-1, 107-2, 107-3, ..., 107-M, respectively. A "row" of the non-volatile memory cells are those memory cells commonly coupled to a given word line 105-1, ..., 105-N. The use of the terms "column" and "row" is not meant to imply a particular linear (e.g., vertical and/or horizontal) orientation of the non-volatile memory cells. A NOR array architecture would be similarly laid out, except that the string of memory cells would be coupled in parallel between the select gates.

Subsets of cells coupled to a selected word line (e.g., 105-1, ..., 105-N) can be programmed and/or sensed (e.g., read) together (e.g., at the same time). A program operation (e.g., a write operation) can include applying a number of program pulses (e.g., 16V-20V) to a selected word line in order to increase the threshold voltage (Vt) of selected cells coupled to that selected access line to a desired program voltage level corresponding to a target (e.g., desired) data state.

A sense operation, such as a read or program verify operation, can include sensing a voltage and/or current change of a bit line coupled to a selected cell in order to determine the data state of the selected cell. The sense operation can include providing a voltage to (e.g., biasing) a bit line (e.g., bit line 107-1) associated with a selected memory cell above a voltage (e.g., bias voltage) provided to a source line (e.g., source line 123) associated with the selected memory cell. A sense operation could alternatively include precharging the bit line followed with discharge when a selected cell begins to conduct, and sensing the discharge.

Sensing the state of a selected cell can include providing a number of ramped sensing signals (e.g., read voltages) to a selected word line while providing a number of pass signals (e.g., read pass voltages) to the word lines coupled to the unselected cells of the string sufficient to place the unselected cells in a conducting state independent of the Vt of the unselected cells. The bit line corresponding to the selected cell being read and/or verified can be sensed to determine whether or not the selected cell conducts in response to the particular sensing voltage applied to the selected word line. For example, the data state of a selected cell can be determined by the word line voltage at which the bit line current reaches a particular reference current associated with a particular state.

As one of ordinary skill in the art will appreciate, in a sense operation performed on a selected memory cell in a NAND string, the unselected memory cells of the string are biased so as to be in a conducting state. In such a sense operation, the data state of the selected cell can be determined based on the current and/or voltage sensed on the bit line corresponding to the string. For instance, the data state of the selected cell can be determined based on whether the bit line current changes by a particular amount or reaches a particular level in a given time period.

When the selected cell is in a conductive state, current flows between the source line contact at one end of the string and a bit line contact at the other end of the string. As such, the current associated with sensing the selected cell is carried through each of the other cells in the string and the select transistors.

Figure 2:
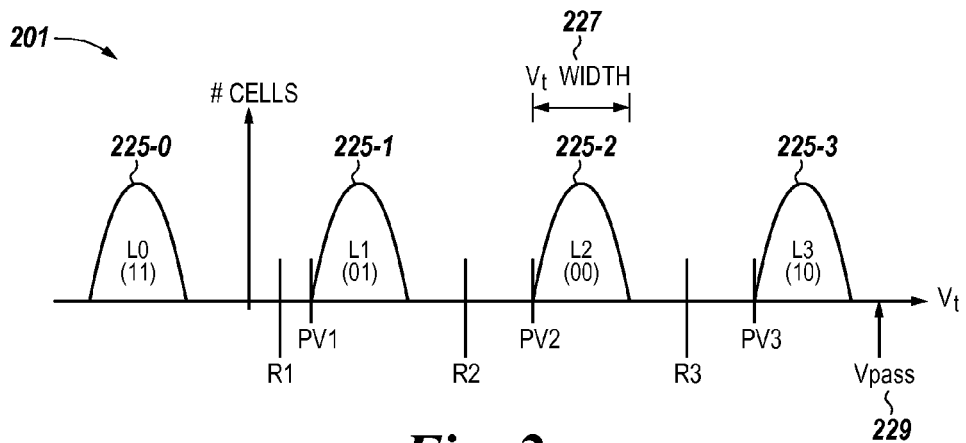
FIG. 2 illustrates a diagram of a number of threshold voltage distributions and sensing voltages in accordance with a number of embodiments of the present disclosure.

FIG. 2 illustrates a diagram 201 of a number of threshold voltage distributions and sensing voltages in accordance with a number of embodiments of the present disclosure. The example shown in FIG. 2 can represent, for example, memory cells 111-1, ..., 111-N previously described in connection with FIG. 1. The example shown in FIG. 2 represents two-bit (e.g., four-state) memory cells. However, embodiments of the present disclosure are not limited to this example of two-bit memory cells, as will be appreciated by one of ordinary skill in the art.

As shown in FIG. 2, threshold voltage (Vt) distributions 225-0, 225-1, 225-2, and 225-3 represent four target states L0, L1, L2, and L3, respectively) to which the memory cells can be programmed. In the example illustrated in FIG. 2, Vt distribution 225-3 can be referred to as an uppermost Vt (e.g., "$Vt_{max}$") to which a cell can be programmed because it is the range including the Vt with the largest magnitude. In operation, the memory cells in a selected block can be erased together such that they have a Vt level within Vt distribution 225-0 prior to being programmed. As such, distribution 225-0 can be referred to as an erased state and can represent a particular stored data state (target state L0) (e.g., stored data such as binary "11"). Target state L1 can correspond to data 01, target state L2 can correspond to data 00, and target state L3 can correspond to data 10. However, embodiments are not limited to these data assignments.

Vt distributions 225-0, 225-1, 225-2, and 225-3 can represent a number of memory cells that are programmed to the corresponding target states, where the height of a Vt distribution curve indicates a number of cells programmed to a particular voltage within the Vt distribution, on average. The width 227 of the Vt distribution curve indicates the range of voltages that represent a particular target state (e.g., the width of the Vt distribution curve 225-2 for L2 represents the range of voltages that correspond to data 00).

A number of sensing voltages are illustrated in FIG. 2. Such sensing voltages can include program verify voltages and/or read voltages, among other sensing voltages. For example, program verify voltages PV1, PV2, and PV3 are illustrated, as well as read voltages R1, R2, and R3. A program verify operation can be performed after one or more programming pulses to help determine whether a memory cell has been programmed within a desired Vt range to help prevent the memory cell from receiving further programming pulses (e.g., "over programming" the cell). For instance, memory cells to be programmed to the L1 target state can be program verified with a voltage PV1. Similarly, program verify voltage PV2 can be used with cells to be programmed to L2 and PV3 can be used with cells to be programmed to L3.

In the example illustrated in FIG. 2, read voltage levels R1, R2, and R3 represent sensing voltages (e.g., read voltages) that can be used to distinguish between states L0, L1, L2, and L3 during a sense operation. In a sense operation performed on a selected memory cell in a NAND string, the unselected memory cells of the string can be biased with a pass voltage "Vpass" 229 so as to be in a conducting state.

The Vt of a memory cell can change (e.g., shift) over time due to a number of mechanisms. For example, the charge storage structure (e.g., floating gate) of the memory cell may lose charge over time. Such charge loss can cause the Vt of the cell to change (e.g., decrease). In some instances, the Vt of memory cells programmed to states L2 and/or L3 may change (e.g., decrease) more than the Vt of memory cells programmed to states L0 and/or L1. Additionally, as the memory cell undergoes program and/or sense operations over time, program disturb and/or read disturb mechanisms may cause the Vt of the cell to change (e.g., increase). Other mechanisms can also cause the Vt of the memory cell to change over time, as will be appreciated by one of ordinary skill in the art.

Figure 3:
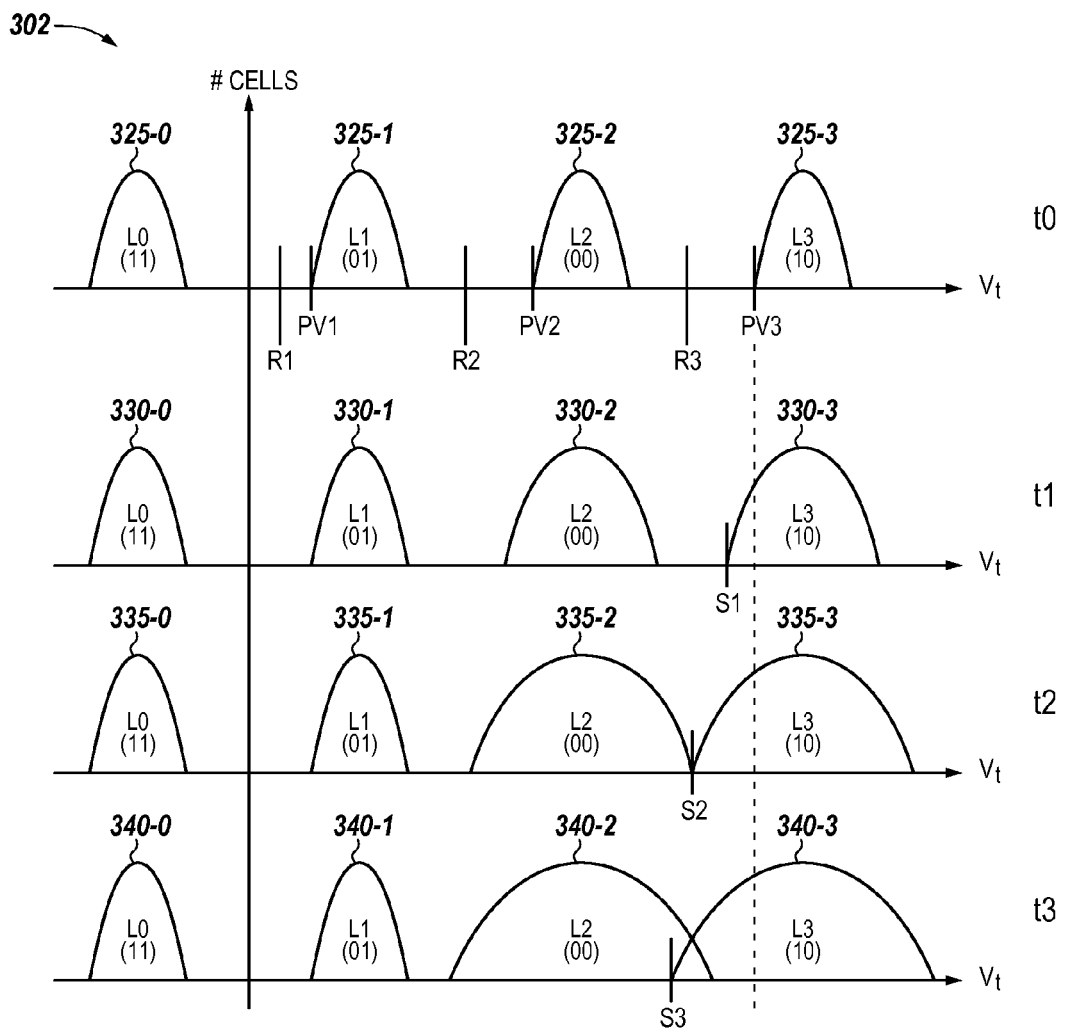
FIG. 3 illustrates a diagram of a number of threshold voltage distributions and sensing voltages at different points in time in accordance with a number of embodiments of the present disclosure.

FIG. 3 illustrates a diagram 302 of a number of threshold voltage distributions and sensing voltages at different points in time (e.g., time t0, time t1, time t2, and time t3) in accordance with a number of embodiments of the present disclosure. The example shown in FIG. 3 can represent memory cells (e.g., memory cells 111-1, . . . , 111-N previously described in connection with FIG. 1) as they undergo a Vt change (e.g., shift) over time due to a mechanism such as charge loss, for example.

Vt distributions 325-0, 325-1, 325-2, and 325-3, program verify voltages PV1, PV2, and PV3, and read voltages R1, R2, and R3 can correspond to Vt distributions 225-0, 225-1, 225-2, and 225-3, program verify voltages PV1, PV2, and PV3, and read voltages R1, R2, and R3 respectively, previously described in connection with FIG. 2 at an initial time t0 (e.g., before the memory cells represented therein undergo any Vt change). Vt distributions 330-0, 330-1, 330-2, and 330-3 can correspond to Vt distributions 325-0, 325-1, 325-2, and 325-3, respectively, at time t1 that is after time t0. Vt distributions 350-0, 335-1, 335-2, and 335-3 can correspond to Vt distributions 325-0, 325-1, 325-2, and 325-3, respectively, at time t2 that is after time t1. Vt distributions 340-0, 340-1, 340-2, and 340-3 can correspond to Vt distributions 325-0, 325-1, 325-2, and 325-3, respectively, at time t3 that is after time t2.

As shown in FIG. 3, Vt distributions 330-2 and 330-3 have shifted relative to Vt distributions 325-2 and 325-3, respectively, due to the memory cells represented therein undergoing Vt shifts from time t0 to time t1. For example, Vt distributions 330-2 and 330-3 are wider than Vt distributions 325-2 and 325-3, respectively, and have shifted to the left relative to Vt distributions 325-2 and 325-3, respectively, as illustrated in FIG. 3. However, in the example illustrated in FIG. 3, Vt distributions 330-0 and 330-1 have not shifted relative to Vt distributions 325-0 and 325-1, respectively (e.g., the memory cells represented therein have not undergone Vt shifts from time t0 to time t1).

As shown in FIG. 3, Vt distributions 335-2 and 335-3 have further shifted relative to Vt distributions 325-2 and 325-3, respectively, due to the memory cells represented therein undergoing further Vt shifts from time t1 to time t2. For example, Vt distributions 335-2 and 335-3 are wider than, and have shifted to the left relative to, Vt distributions 330-2 and 330-3, respectively, such that portions of Vt distributions 335-2 and 335-3 are adjacent, as illustrated in FIG. 3. However, in the example illustrated in FIG. 3, Vt distributions 335-0 and 335-1 have not shifted relative to Vt distributions 325-0 and 325-1, respectively (e.g., the memory cells represented therein have not undergone Vt shifts from time t1 to time t2).

As shown in FIG. 3, Vt distributions 340-2 and 340-3 have further shifted relative to Vt distributions 325-2 and 325-3, respectively, due to the memory cells represented therein undergoing further Vt shifts from time t2 to time t3. For example, Vt distributions 340-2 and 340-3 are wider than, and have shifted to the left relative to, Vt distributions 335-2 and 335-3, respectively, such that portions of Vt distributions 340-2 and 340-3 overlap, as illustrated in FIG. 3. However, in the example illustrated in FIG. 3, Vt distributions 340-0 and 340-1 have not shifted relative to Vt distributions 325-0 and 325-1, respectively (e.g., the memory cells represented therein have not undergone Vt shifts from time t2 to time t3).

The example illustrated in FIG. 3 includes sensing (e.g., read) voltages S1, S2, and S3. Sensing voltage S1 can be the sensing voltage that results in a particular error rate being associated with a sense (e.g., read) operation performed on the memory cells programmed to target state L3 at time t1 using sensing voltage S1, sensing voltage S2 can be the sensing voltage that results in the particular error rate being associated with a sense operation performed on the memory cells programmed to target state L3 at time t2 using sensing voltage S2, and sensing voltage S3 can be the sensing voltage that results in the particular error rate being associated with a sense operation performed on the memory cells programmed to target state L3 at time t3 using sensing voltage S3.

As used herein, an "error rate" can be, for example, a bit error rate (BER), and can refer to an amount of erroneous bits corresponding to an amount erroneous of data sensed from a memory (e.g., the memory cells programmed to target state L3) during a sense operation divided by the total amount of data sensed during the sense operation. That is, the particular error rate can include a particular amount of erroneous data (e.g., bits) being sensed during the sense operation. The particular amount of erroneous data can be, for example, a particular (e.g., the largest) amount of erroneous data correctable by an error correction operation performed on data sensed during the sense operation. That is, the particular error rate can be a particular (e.g., the highest) error rate that does not result in a failure of an error correction operation performed on the data sensed during the sense operation, as will be further described herein (e.g., in connection with FIG. 4).

As an additional example, sensing voltage S1 can be the sensing voltage that is a particular number of (e.g., four) standard deviations from the mean (e.g., peak) Vt level of Vt distribution 330-3, sensing voltage S2 can be the sensing voltage that is the particular number of standard deviations from the mean Vt level of Vt distribution 335-3, and sensing voltage S3 can be the sensing voltage that is the particular number of standard deviations from the mean Vt level of Vt distribution 340-3. That is, sensing voltages S1, S2, and S3 can correspond to the tails of Vt distributions 330-3, 335-3, and 340-3, respectively.

The difference between sensing voltage S1 and program verify voltage PV3 can indicate the age of the data stored in the memory cells (e.g., how long the data has been stored in the memory cells) represented in FIG. 3 at time t1, the difference between sensing voltage S2 and program verify voltage PV3 can indicate the age of the data stored in the memory cells represented in FIG. 3 at time t2, and the difference between sensing voltage S3 and program verify voltage PV3 can indicate the age of the data stored in the memory cells represented in FIG. 3 at time t3. For example, the greater the difference between program verify voltage PV3 and sensing voltages S1, S2, and S3, the greater the age of the data stored in the memory cells represented in FIG. 3 at times t1, t2, and t3, respectively. That is, in the example illustrated in FIG. 3, the age of the data stored in the memory cells is greater at time t1 than at time t0, is greater at time t2 than at time t1, and is greater at time t3 than at time t2. An example mapping the difference between program verify voltage PV3 and sensing voltages S1, S2, and S3 to the age of the data stored in the memory cells will be further described herein (e.g., in connection with FIG. 5).

Figures 4, 5:
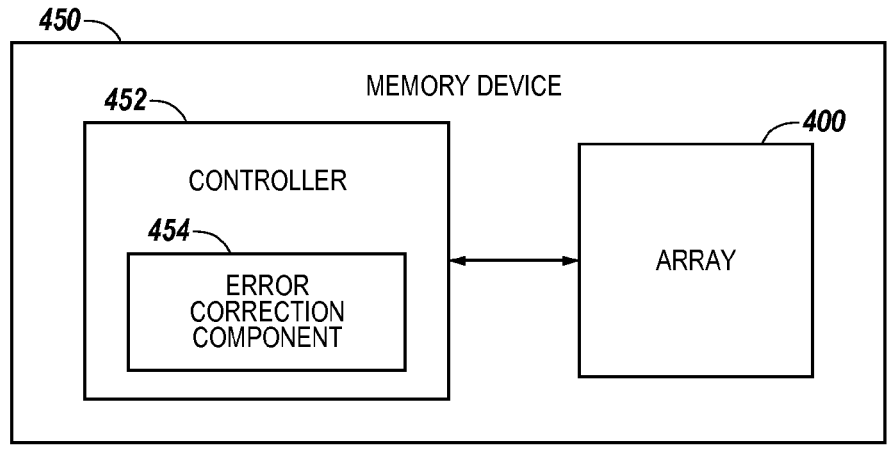
FIG. 4 illustrates a block diagram of an apparatus in the form of a memory device in accordance with a number of embodiments of the present disclosure.
FIG. 5 illustrates a table of an example mapping of the difference between a program verify voltage and a sensing voltage that results in a particular error rate being associated with a sense operation performed on memory cells to the age of the data stored in the memory cells in accordance with one or more embodiments of the present disclosure.

FIG. 4 illustrates a block diagram of an apparatus in the form of a memory device 450 in accordance with a number of embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example.

As shown in FIG. 4, memory device 450 includes a controller 452 coupled to a memory array 400. Memory array 400 can be, for example, memory array 100 previously described in connection with FIG. 1. Although one memory array is shown in FIG. 4, embodiments of the present disclosure are not so limited (e.g., memory device 450 can include more than one memory array coupled to controller 452).

Controller 452 can include, for example, control circuitry and/or logic (e.g., hardware and firmware). For instance, controller 452 can include an error correction component 454, as shown in FIG. 4. Error correction component can be, for example, an error correction code (ECC) engine. However, embodiments of the present disclosure are not limited to a particular type of error correction component.

Controller 452 can be included on the same physical device (e.g., the same die) as memory array 400, or can be included on a separate physical device that is communicatively coupled to the physical device that includes memory array 400. In a number of embodiments, components of controller 452 can be spread across multiple physical devices (e.g., some components on the same die as the array, and some components on a different die, module, or board) as a distributed controller.

Controller 452 (e.g., error correction component 454) can determine (e.g., search for) a sensing (e.g., read) voltage that results in a particular error rate being associated with a sense operation performed on memory cells of memory array 400. For example, controller 452 can determine the sensing voltage that results in the particular error rate being associated with a sense operation performed on the memory cells of memory array 400 programmed to a particular one of a number of (e.g., four) target states using the sensing voltage. The particular one of the number of target states can be, for example, the target state associated with the uppermost Vt distribution of the different Vt distributions that represent the target states. For instance, the target states can be target states L0, L1, L2, and L3 previously described in connection with FIGS. 2 and 3, the particular one of the target states can be target state L3, and the sensing voltage can be sensing voltage S1, S2, and/or S3 previously described in connection with FIG. 3. However, embodiments of the present disclosure are not limited to such an example.

As an example, controller 452 can determine the sensing voltage that results in the particular error rate by performing a first sense operation on the memory cells of memory array 400 using a first sensing voltage, and determining whether the particular error rate is associated with the first sensing operation. If the particular error rate is associated with the first sense operation, then controller 452 can determine that the first sensing voltage is the sensing voltage that results in the particular error rate. If the particular error rate is not associated with the first sensing operation (e.g., if an error rate other than the particular error rate is associated with the first sensing operation), then controller 452 can perform a second sense operation on the memory cells of memory array 400 using a second (e.g., different) sensing voltage, and determine whether the particular error rate is associated with the second sense operation. If the particular error rate is associated with the second sense operation, then controller 452 can determine that the second sensing voltage is the sensing voltage that results in the particular error rate. If the particular error rate is not associated with the second sense operation, controller 452 can continue this process (e.g., perform additional sense operations using additional sensing voltages and determine whether the particular error rate is associated with the additional sense operations) until the sensing voltage that results in the particular error rate is determined.

The particular error rate can include a particular amount of erroneous data (e.g., bits) being sensed during the sense operation, as previously described herein (e.g., in connection with FIG. 3). The particular amount of erroneous data can be, for example, a particular (e.g., the largest) amount of erroneous data correctable by an error correction operation performed on data sensed during the sense operation by error correction component 454. That is, the particular error rate can be a particular (e.g., the highest) error rate that does not result in a failure of an error correction operation performed on the data sensed during the sense operation. An error correction operation can result in failure if error correction component 454 is unable to correct errors associated with the sensed data. Error correction component 454 may be unable to correct errors associated with the sensed data if the number of errors associated with the sensed data exceeds the correction capability of error correction component 454. That is, the particular error rate can correspond to the correction capability of error correction component 454, which can be, for example, 75 bit errors. However, embodiments of the present disclosure are not limited to a particular correction capability for error correction component 454.

As an additional example, the sensing voltage that results in the particular error rate can be the sensing voltage that is a particular number of (e.g., four) standard deviations from the mean (e.g., peak) Vt level of a Vt distribution (e.g., the uppermost Vt distribution) associated with the memory cells of memory array 400. That is, the sensing voltage can correspond to the tail of the Vt distribution. The mean Vt level of the Vt distribution, and the sensing voltage that is the particular number of standard deviations from the mean Vt level, can be determined by controller 452.

In some embodiments, controller 452 can determine the sensing voltage that results in the particular error rate at a particular time interval while memory device 450 is powered up (e.g., turned on). For example, controller 452 can determine the sensing voltage at time t1, t2, and t3 previously described in connection with FIG. 3. However, embodiments of the present disclosure are not limited to a particular time interval for determining the sensing voltage. In some embodiments, controller 452 can determine the sensing voltage that results in the particular error rate responsive to a power up of memory device 450 (e.g., responsive to memory device 450 being turned on).

Controller 452 can determine the difference between the determined sensing voltage that results in the particular error rate and a program verify voltage associated with the memory cells of memory array 400. For example, controller 452 can determine the difference between the determined sensing voltage and the program verify voltage associated with the Vt distribution that represents the particular one of the number of target states to which the memory cells of memory array 400 are programmed. That is, the program verify voltage can be the program verify voltage associated with the uppermost Vt distribution of the different Vt distributions that represent the target states. For instance, the program verify voltage can be program verify voltage PV3 previously described in connection with FIGS. 2 and 3. However, embodiments of the present disclosure are not limited to a particular program verify voltage.

Controller 452 can determine the age of the data stored in the memory cells (e.g., how long the data has been stored in the memory cells) of memory array 400 based on the difference between the program verify voltage and the sensing voltage that results in the particular error rate. For example, the greater the difference between the program verify voltage and the sensing voltage that results in the particular error rate, the greater the age of the data stored in the memory cells of memory array 400. An example mapping the difference between the program verify voltage and the sensing voltage to the age of the data stored in the memory cells will be further described herein (e.g., in connection with FIG. 5).

In embodiments in which the sensing voltage that results in the particular error rate is determined at a particular time interval, the age of the data stored in the memory cells can also be determined at the particular time interval. In embodiments in which the sensing voltage that results in the particular error rate is determined responsive to a power up of memory device 450, the age of the data stored in the memory cells can also be determined at the power up of memory device 450.

As such, controller 452 can determine the age of the data stored in the memory cells of memory array 400 without using a reference cell. That is, memory array 400 may not have to include a reference cell for controller 452 to be able to determine the age of the data stored in the memory cells of memory array 400. This can reduce the size, reduce the complexity, and/or increase the performance (e.g., increase the speed, increase the reliability, and/or decrease the power consumption) of memory device 450, among other benefits.

Further, the age of the data determined by controller 452 can include an amount of time during which memory device 450 is powered off (e.g., not turned on). That is, the age of the data determined by controller 452 can track and/or take into account the amount of time for which memory device 450 is powered off while storing the data. Therefore, controller 452 can determine the age of data stored in the memory cells of memory array 400 more effectively, accurately, and/or reliably than previous approaches (e.g., approaches that can not track and/or take into account the amount of time for which the memory is powered off).

In some embodiments, controller 452 can refresh the data stored in the memory cells of memory array 400 if the determined age of the data meets or exceeds a threshold age. That is, controller 452 can program (e.g., re-program) the memory cells of memory array 400 to the target state to which the memory cells were previously programmed if the determined age of the data meets or exceeds the threshold age. The threshold age can be, for example, one month or three months. However, embodiments of the present disclosure are not limited to a particular threshold age.

The embodiment illustrated in FIG. 4 can include additional circuitry, logic, and/or components not illustrated so as not to obscure embodiments of the present disclosure. For example, memory device 450 can include address circuitry to latch address signals provided over I/O connectors through I/O circuitry. Address signals can be received and decoded by a row decoder and a column decoder, to access memory array 400.

FIG. 5 illustrates a table 560 of an example mapping of the difference between a program verify voltage and a sensing voltage determined to result in a particular error rate being associated with a sense operation performed on memory cells (e.g., the memory cells of memory array 400 previously described in connection with FIG. 4) to the age of the data stored in the memory cells in accordance with one or more embodiments of the present disclosure. The sensing voltage determined to result in the particular error rate, and the difference between the program verify voltage and the determined sensing voltage, can be, for example, determined by controller 452 as previously described herein (e.g., in connection with FIG. 4).

As shown in table 560, the greater the difference between the program verify voltage and the sensing voltage determined to result in the particular error rate, the greater the age of the data stored in the memory cells. For instance, in the example illustrated in FIG. 5, if the difference between the program verify voltage and the determined sensing voltage is 0 to 50 millivolts (mV), the age of the data is less than 15 days, if the difference between the program verify voltage and the determined sensing voltage is 50 to 150 mV, the age of the data is one month, if the difference between the program verify voltage and the determined sensing voltage is 150 to 300 mV, the age of the data is two months, if the difference between the program verify voltage and the determined sensing voltage is 300 to 500 mV, the age of the data is three months, and if the difference between the program verify voltage and the determined sensing voltage is 500 to 1000 mV, the age of the data is six months. Embodiments of the present disclosure, however, are not limited to the example mapping of table 560 illustrated in FIG. 5.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for operating memory, comprising:
  determining a read voltage that results in a particular error rate being associated with a sense operation performed on a memory using the read voltage;
  determining a difference between the determined read voltage and a program verify voltage associated with the memory; and
  determining an age of data stored in the memory based on the determined difference, wherein the age of the data stored in the memory includes an amount of time during which the memory is powered off.

2. The method of claim 1, wherein the method includes determining the read voltage at a particular time interval while the memory is powered up.

3. The method of claim 1, wherein the method includes determining the read voltage responsive to a power up of the memory.

4. The method of claim 1, wherein the method includes determining the age of the data stored in the memory without using a reference cell.

5. The method of claim 1, wherein the method includes refreshing the data stored in the memory if the determined age meets or exceeds a threshold age.

6. An apparatus, comprising:
  a memory; and
  a controller coupled to the memory and configured to:
    determine a read voltage that results in a particular error rate being associated with a sense operation performed on the memory using the read voltage; and
    determine an age of data stored in the memory using a table populated with a plurality of correspondences between the age of the data stored in the memory and a difference between the determined read voltage and a program verify voltage associated with the memory.

7. The apparatus of claim 6, wherein the particular error rate being associated with the sense operation includes a particular amount of erroneous data being sensed during the sense operation.

8. The apparatus of claim 7, wherein the particular amount of erroneous data is a largest amount of erroneous data correctable by an error correction operation performed by the controller.

9. The apparatus of claim 6, wherein the read voltage that results in the particular error rate is a particular number of standard deviations from a mean threshold voltage level of a threshold voltage distribution associated with the memory.

10. The apparatus of claim 9, wherein the particular number is four.

11. The apparatus of claim 6, wherein the controller is configured to program the memory to a target state to which the memory was previously programmed if the determined age meets or exceeds a threshold age.

12. The apparatus of claim 6, wherein the controller is configured to determine the read voltage that results in the particular error rate by:
  performing a number of sense operations on the memory using a number of sensing read voltages; and
  determining whether the particular error rate is associated with any of the number of sense operations.

13. A method for operating memory, comprising:
  determining, at a particular time interval, a read voltage that results in a particular error rate being associated with a sense operation performed on a memory using the read voltage; and
  determining, at the particular time interval, an age of data stored in the memory using a table populated with a plurality of correspondences between the age of the data stored in the memory and a difference between the determined read voltage and a program verify voltage associated with the memory.

14. The method of claim 13, wherein the program verify voltage is a program verify voltage associated with an uppermost threshold voltage distribution associated with the memory.

15. The method of claim 13, wherein the particular error rate being associated with the sense operation is a particular error rate that does not result in a failure of an error correction operation performed on data sensed during the sense operation.

16. The method of claim 15, wherein the particular error rate that does not result in a failure of the error correction operation is a highest error rate that does not result in a failure of the error correction operation.

17. An apparatus, comprising:
  a memory; and
  a controller coupled to the memory and configured to:
    determine, responsive to a power up of the apparatus, a read voltage that results in a particular error rate being associated with a sense operation performed on the memory using the read voltage;
    determine a difference between the determined read voltage and a program verify voltage associated with the memory; and
    determine an age of data stored in the memory at the power up of the apparatus based on the determined difference, wherein the age of the data stored in the memory includes an amount of time during which the apparatus is powered off.

18. The apparatus of claim 17, wherein the controller includes an error correction component configured to determine the read voltage that results in the particular error rate.

19. The apparatus of claim 17, wherein:
  the memory includes memory cells programmed to a number of target states, wherein each of the number of target states is associated with a different threshold voltage distribution;
  the controller is configured to determine, responsive to the power up of the apparatus, a read voltage that results in the particular error rate being associated with a sense operation performed on the memory cells programmed to a particular one of the number of target states using the read voltage; and
  the program verify voltage is associated with the threshold voltage distribution that is associated with the particular one of the number of target states.

20. The apparatus of claim 19, wherein the particular one of the number of target states is associated with an uppermost threshold voltage distribution.

21. A method for operating memory, comprising:
  determining a read voltage that results in a particular error rate being associated with a sense operation performed on a memory using the read voltage;
  determining a difference between the determined read voltage and a program verify voltage associated with the memory; and
  determining an age of data stored in the memory based on the determined difference and without using a reference cell, wherein determining the age of the data stored in the memory includes determining an amount of time the memory is powered off while storing the data.

22. The method of claim 21, wherein the program verify voltage associated with the memory is a voltage used to verify the memory has been programmed to a target state.

23. The method of claim 21, wherein the method includes:
  using a controller to determine the read voltage;
  using a controller to determine the difference between the determined read voltage and the program verify voltage; and
  using a controller to determine the age of the data stored in the memory.

* * * * *